United States Patent
Yu et al.

(10) Patent No.: US 8,467,233 B2
(45) Date of Patent: Jun. 18, 2013

(54) ASYMMETRIC STATIC RANDOM ACCESS MEMORY CELL WITH DUAL STRESS LINER

(75) Inventors: Shaofeng Yu, Plano, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 13/154,225

(22) Filed: Jun. 6, 2011

(65) Prior Publication Data
US 2012/0307550 A1    Dec. 6, 2012

(51) Int. Cl.
*G11C 11/00* (2006.01)
(52) U.S. Cl.
USPC .............. 365/156; 365/189.07; 365/189.09
(58) Field of Classification Search
USPC ................................ 365/156, 189.07, 189.09
See application file for complete search history.

(56) References Cited

U.S. PATENT DOCUMENTS

| | | | | |
|---|---|---|---|---|
| 5,373,170 | A * | 12/1994 | Pfiester et al. | 257/69 |
| 6,061,268 | A * | 5/2000 | Kuo et al. | 365/156 |
| 7,119,601 | B2 | 10/2006 | Grimone, III | |
| 7,585,720 | B2 | 9/2009 | Sudo | |
| 7,746,685 | B2 * | 6/2010 | Kawasumi et al. | 365/154 |
| 7,843,024 | B2 | 11/2010 | Chidambarrao et al. | |
| 7,885,092 | B2 * | 2/2011 | Uematsu | 365/154 |
| 7,906,383 | B2 | 3/2011 | Richter et al. | |
| 7,920,438 | B2 * | 4/2011 | Yamaoka et al. | 365/226 |
| 8,035,166 | B2 | 10/2011 | Sadoughi | |
| 8,125,837 | B2 * | 2/2012 | Yamaoka et al. | 365/189.07 |
| 2010/0315862 | A1 | 12/2010 | Huang et al. | |

OTHER PUBLICATIONS

Kim et al., "Technology Circuit Co-Design of Asymmetric SRAM Cells for Read Stability Improvement", Custom Integrated Circuits Conference (IEEE, Sep. 2010), pp. 1-4.
Azizi et al., "Low-Leakage Asymmetric-Cell SRAM", Trans. on VLSI Systems, vol. 11, No. 4 (IEEE, 2003), pp. 701-715.
Kim et al., "Independent-Gate Controlled Asymmetrical SRAM Cells in Double-Gate MOSFET Technology for Improved READ Stability", Proc. of the 32nd European Solid-State Circuits Conference (IEEE, 2006), pp. 74-77.
Kim et al., "Asymmetrical SRAM Cells with Enhanced Read and Write Margins", Int'l Symp. on VLSI Technology, Systems, and Applications (IEEE, 2007), pp. 162-163.

* cited by examiner

*Primary Examiner* — Pho M Luu
(74) *Attorney, Agent, or Firm* — Rose Alyssa Keagy; Wade J. Brady, III; Frederick J. Telecky, Jr.

(57) ABSTRACT

A solid-state memory in which each memory cell is constructed of complementary metal-oxide-semiconductor (CMOS) inverters implemented with dual stress liner (DSL) technology. Asymmetry is incorporated into each memory cell by constructing one of the inverter transistors or the pass-gate transistor using the stress liner with opposite stress characteristics from its opposing counterpart. For example, both of the p-channel load transistors and one of the n-channel driver transistors in each memory cell may be constructed with a compressive nitride liner layer while the other driver transistor is constructed with a tensile nitride liner layer. In another implementation, one of the n-channel pass-gate transistors is constructed with a compressive nitride liner layer while the other pass-gate transistor is constructed with a tensile nitride liner layer. Improved cell stability due to the resulting asymmetric behavior is implemented in a cost-free manner.

16 Claims, 14 Drawing Sheets

ASYMMETRIC STATIC RANDOM ACCESS MEMORY CELL WITH DUAL STRESS LINER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to static random access memory (SRAM) cells and devices.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1a. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged to a high voltage (at or near power supply voltage $V_{dda}$), and are equalized to the same voltage. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT of cell 2 of FIG. 1a, if bit line $BLT_k$ is unable to sufficiently discharge storage node SNT to the trip the inverters, cell 2 may not latch to the desired data state.

Cell stability failures are the converse of write failures—a write failure occurs if a cell is too stubborn in changing its state, while a cell stability failure occurs if a cell changes its state too easily, such as may occur to a memory cell in a selected row but an unselected column (i.e., a "half-selected" cell) during a write to a cell in a selected column in its same row. Noise of sufficient magnitude coupling to the bit lines of the half-selected columns, during a write to the selected columns in the same row, can cause a false write of data to those half-selected columns. In effect, such write cycle noise can be of sufficient magnitude as to trip the inverters of one or more of the half-selected cells. The possibility of such stability failure is exacerbated by device mismatch and variability, as discussed above.

In conventional SRAM cells such as 6-T SRAM cell 2 of FIG. 1a, the designer is therefore faced with a tradeoff between cell stability on one hand, and write margin on the other. In a general sense, cell stability is favored by pass-gate transistors 5a, 5b having relatively weak drive as compared with load transistors 3 and driver transistors 4, because this results in weak coupling between the bit lines and storage nodes and relatively strong drive of the latched state at storage nodes SNT, SNB. Conversely, write margin is favored by pass-gate transistors 5a, 5b having relatively strong drive as compared with load transistors 3 and driver transistors 4, because this enables strong coupling between the bit lines and storage nodes, resulting in storage nodes SNT, SNB having weak resistance to changing state. Accordingly, the design of conventional 6-T SRAM cells 2 involves a tradeoff between these two vulnerabilities.

Unfortunately, the design window in which both adequate cell stability and adequate write margin can be attained is becoming smaller with continued scaling-down of device feature sizes, for the reasons mentioned above. In addition, it has been observed that the relative drive capability of p-channel MOS transistors relative to n-channel MOS transistors is increasing as device feature sizes continue to shrink, which skews the design window toward cell stability over write margin.

One conventional approach toward relaxing these ever-tightening design constraints is known in the art as "write-assist". According to this approach, the power supply bias applied to SRAM cells (e.g., power supply voltage $V_{dda}$ of FIG. 1a) in write cycles is reduced, or disconnected so as to float. Conventional write-assist circuitry includes a power switch associated with each column of an array, or in some cases associated with multiple columns. Floating write assist bias in write cycles is attained by the power switch disconnecting cells in the selected column from the power supply voltage. In one approach, reduced voltage write assist bias turns off, in write cycles, a power switch that is connected in parallel with a diode-connected transistor between the memory cells and the power supply voltage. The cell bias in the selected column is thus at least a diode voltage drop from the full power supply voltage, during write cycles. For either reduced or floating write assist bias, the drive of the load and driver transistors in the SRAM cell is reduced relative to the drive of the pass-gate transistors, making it easier for the low level bit line to flip the state of the addressed cell.

Another conventional approach addressing the shrinking design window to satisfy both cell stability and write margin constraints is the construction of high performance SRAM memories using eight transistor ("8-T") memory cells. As known in the art, the 8-T SRAM cell consists of a 6-T latch as shown in FIG. 1a, in combination with a two-transistor read buffer. Each cell receives separate read and write word lines and separate read and write bit lines. The complementary write bit lines are selectively coupled to the storage nodes of the 6-T latch by the pass-gate transistors gated by the write word line, as in the conventional 6-T SRAM cell. The read buffer includes the series connection of a drive transistor gated by one of the storage nodes and a pass-gate transistor gated by the read word line, connected between a reference voltage (e.g., ground) and the read bit line. In this 8-T construction, the pass-gate transistors involved in the write cycle can have strong drive to provide good write margin, without affecting cell stability during read operations (because those pass-gate transistors remain off). However, in an interleaved architecture, half-selected cells in a write cycle (i.e., cells in the selected row that are not being written) can still exhibit cell instability, because the write word line will be energized in that situation. To avoid this situation, the 8-T cells are implemented in a non-interleaved architecture, in which the entire selected row of cells is written in a write cycle. As known in the art, non-interleaved memory arrays are vulnerable to multiple-bit soft error failures, and consume additional chip area. In addition, these conventional 8-T cells source a single-ended read, rather than the differential signal sourced by the 6-T cell; either the read signal is reduced as a result, or the device sizes for the read buffer must be increased to compensate for that weaker signal.

In many conventional implementations, the transistors in the 6-T SRAM cell are constructed to symmetrically match one another as closely as possible, in attempts to optimize stability between the two data states. However, it is also known in the art that cell stability in some SRAM 6-T cells can be improved by intentional asymmetry in the construction of the SRAM cell. FIG. 1b illustrates examples of the well-known DC "butterfly" transfer function curves for a 6-T SRAM cell such as cell 2 of FIG. 1a, to illustrate the potential benefit of asymmetric construction.

In the familiar fashion, the butterfly curves of FIG. 1b illustrate the voltages at storage nodes SNT, SNB of cell 2 in their two potential data states, and transitions between the two. In this example, the "1" data state is at stable point DS1 at which voltage $V_{SNT}$ at storage node SNT is near power supply voltage $V_{dda}$ and voltage $V_{SNB}$ at storage node SNB is near ground ($V_{ssa}$); conversely, the "0" data state is at stable point DS0, with voltage $V_{SNB}$ near power supply voltage $V_{dda}$ and voltage $V_{SNT}$ near ground. Transfer characteristic $TF_{1-0}$ shows the voltages at storage nodes SNT, SNB for a transition from stable point DS1 to stable point DS0 (a "1" to "0" transition). For cell 2 of symmetric construction, in which n-channel driver transistors 4a, 4b are matched to one another, and p-channel load transistors 3a, 3b are matched to one another, transfer characteristic $TF_{0-1}$ shows the voltages at storage nodes SNT, SNB for the transition from stable point DS0 to stable point DS1 (a "0" to "1" transition).

As mentioned above, cell stability refers to the ability of SRAM cell 2 to withstand static noise without changing states. A quantitative measure of cell stability is referred to in the art as static noise margin, which corresponds to the noise at a storage node that the cell can tolerate without changing its logic state, and can be approximated by the area of the largest square that fits between transfer characteristics for the two state transitions. For example, FIG. 1b illustrates static noise margin $SNM_{SYM}$ for SRAM cell 2 of symmetric construction case, as the area of the largest square that fits between transfer characteristics $TF_{1-0}$, $TF_{0-1}$.

As mentioned above, asymmetric construction of SRAM cell 2 can, in some situations, increase the cell stability (i.e., increase the static noise margin). FIG. 1b illustrates such increased static noise margin, for an example of an SRAM cell 2 in which driver transistor 4a has a higher threshold voltage (e.g., 100 mV) than that of driver transistor 4b. Transfer characteristic $TF_{0-1}'$ illustrates the effect of this asymmetric construction on the "0" to "1" transition, and the resulting static noise margin $SNM_{ASYM}$. As shown by the example of FIG. 1b, in that particular situation, static noise margin $SNM_{ASYM}$ is improved for the asymmetric construction of SRAM cell 2 over that shown by static noise margin $SNM_{SYM}$ for its symmetric construction.

Recent advances in semiconductor technology as applied to integrated circuits include the use of "strain engineering" (or, alternatively, "stress engineering") in the manufacture of semiconductor device structures. It has been discovered that the tuning of strain in the crystal lattice of metal-oxide-semiconductor (MOS) transistor channel regions can enhance carrier mobility in those regions. As is fundamental in MOS device technology, the source/drain current (i.e., drive) of an MOS transistor in both the triode and saturation regions is proportional to carrier mobility in the channel region. In a general sense, longitudinal compressive stress enhances hole mobility in the channel region of a p-channel MOS transistor, and longitudinal tensile stress enhances electron mobility in the channel region of an n-channel MOS transistor.

One conventional strain engineering approach is referred to in the art as "dual stress liner", or "DSL", technology. According to this approach, a silicon nitride layer of either tensile or compressive characteristics is deposited over the surface of the integrated circuit, and patterned and etched to remain only over the active regions (i.e., source and drain regions) of transistors that are to receive the resulting stress. Tensile silicon nitride is used to enhance n-channel MOS transistors, and compressive silicon nitride is used to enhance p-channel MOS transistors. In CMOS integrated circuits including both p-channel and n-channel MOS transistors, both tensile and compressive nitride layers can be applied, to the n-channel and p-channel transistors respectively, to improve the performance characteristics of both conductivity types.

BRIEF SUMMARY OF THE INVENTION

Embodiments of this invention provide a memory cell, and method of constructing the same, in which static noise margin is improved without requiring increase in chip area.

Embodiments of this invention provide such a memory cell and method in which static noise margin is improved in a cost-free manner, from the standpoint of manufacturing cost.

Embodiments of this invention provide such a memory cell and method in which static noise margin is improved without requiring changes to circuit design.

Embodiments of this invention provide such a memory cell and method that are compatible with conventional complementary metal-oxide-semiconductor (CMOS) technology.

Embodiments of this invention provide such a memory cell and method that are compatible with modern sub-micron transistor sizes.

Other objects and advantages of this invention will be apparent to those of ordinary skill in the art having reference to the following specification together with its drawings.

The present invention may be implemented into a static random access memory (SRAM) cell of the cross-coupled inverter type, constructed using complementary metal-oxide-semiconductor (MOS) transistors. Each memory cell is constructed in an asymmetric manner, with one or more transistors on one side of the cell having different transistor characteristics from the same device or transistors on the other side of the cell. The memory is constructed using dual stress liner (DSL) technology, in which a compressive nitride liner is nominally disposed over p-channel MOS transistors, and in which a tensile nitride liner is nominally disposed over n-channel MOS transistors. The asymmetry is implemented by forming the nitride liner over the pass-gate transistor (between storage node and bit line) or driver transistor, or both, on one side of the cell of the opposite stress characteristic than that indicated for its channel conductivity. For example, the n-channel pass or driver transistor (or both) on one side of the cell is constructed using a compressive nitride liner.

BRIEF DESCRIPTION OF THE SEVERAL VIEWS OF THE DRAWING

FIG. 8b is a plan layout view of a portion of a memory array illustrating the placement of compressive and tensile liner layers for asymmetric behavior according to the embodiment of the invention shown in FIG. 8a.

FIG. 9b is a plan layout view of a portion of a memory array illustrating the placement of compressive and tensile liner layers for asymmetric behavior according to the embodiment of the invention shown in FIG. 9a.

DETAILED DESCRIPTION OF THE INVENTION

The present invention will be described in connection with its embodiments, namely as implemented into a static random access memory (SRAM) embedded within a larger scale integrated circuit, and constructed according to complementary metal-oxide-semiconductor (CMOS) technology, because it is contemplated that this invention is especially beneficial in such an application. However, it is contemplated that those skilled in the art having reference to this specification will readily recognize that this invention may be applied to a wide range of memory devices. Accordingly, it is to be understood that the following description is provided by way of example only, and is not intended to limit the true scope of this invention as claimed.

Figure 1A:
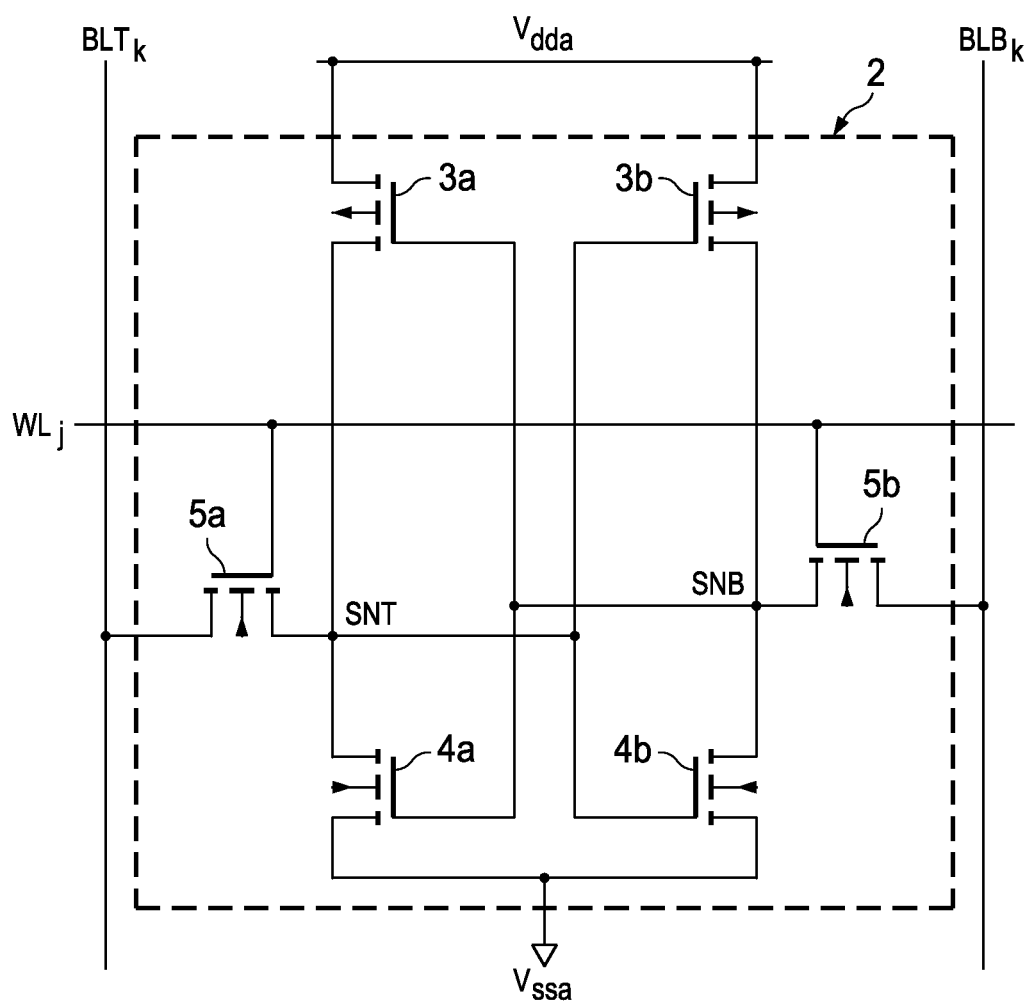
FIG. 1a is an electrical diagram, in schematic form, of a conventional 6-transistor static random access memory (SRAM) cell.
Figure 1B:
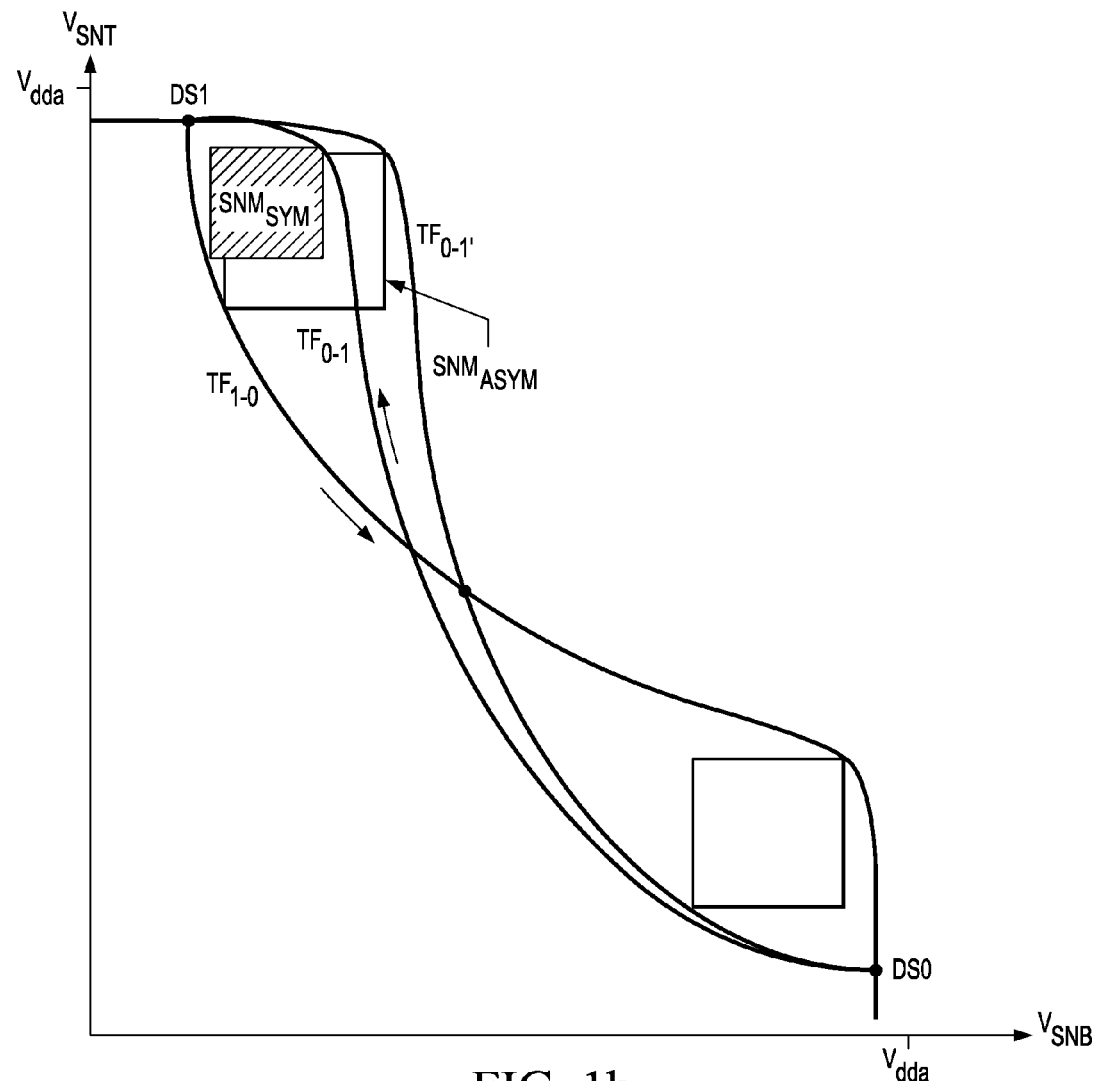
FIG. 1b is a plot of transfer function curves for a conventional 6-T SRAM memory cell, illustrating the effects of asymmetry.
Figure 2:
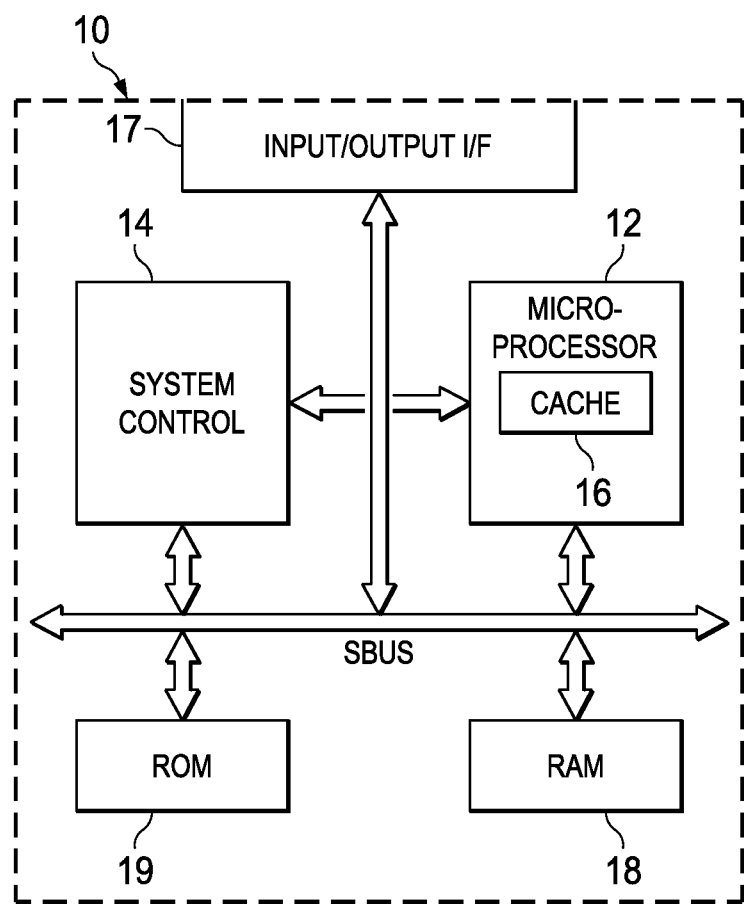
FIG. 2 is an electrical diagram, in block form, of a large scale integrated circuit constructed according to embodiments of the invention.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. Typically, ROM 19 serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Figure 3:
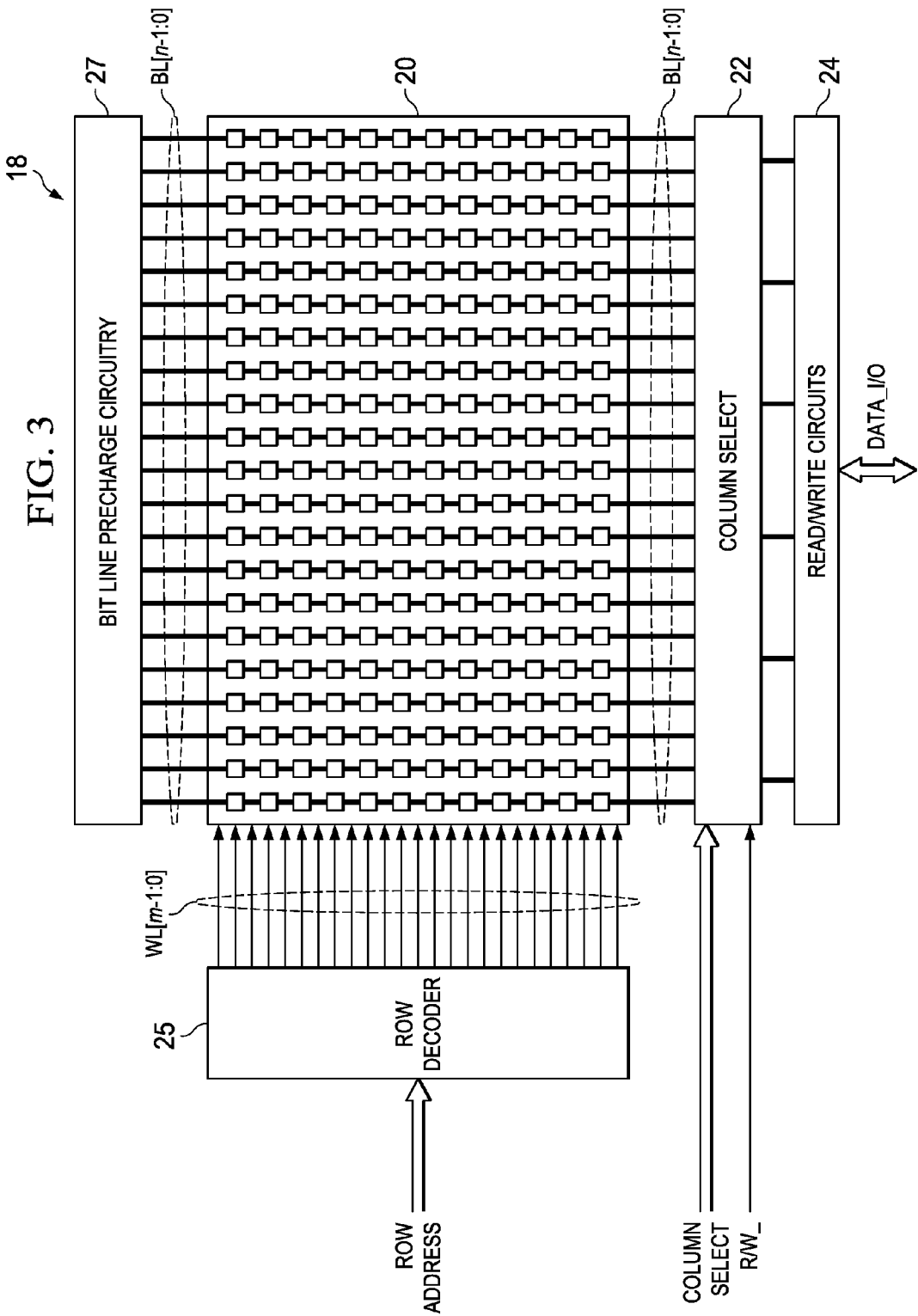
FIG. 3 is an electrical diagram, in block form, of a memory in the integrated circuit of FIG. 2, constructed according to an embodiment of the invention.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18. The construction of these memory cells according to embodiments of this invention will be described in further detail below. In this example, memory array 20 includes m rows and n columns of SRAM cells, with cells in the same column sharing a pair of bit lines BL[n-1:0], and with memory cells in the same row sharing one of word lines WL[m-1:0]. Bit line precharge circuitry 27 is provided to apply a desired precharge voltage to the pairs of bit lines BL[n-1:0] in advance of read and write operations. Row decoder 25 receives a row address value indicating the row of memory array 20 to be accessed, and energizes the one of word lines WL[m-1:0] corresponding to that row address value. Column select circuit 22 receives a column address value, and in response selects pairs of bit lines BL[n-1:0] associated with one or more columns to be placed in communication with read/write circuits 24. Read/write circuits 24 are constructed in the conventional manner, for example to include the typical differential amplifier coupled to the bit lines for a column as selected by column select circuit 22 and a write circuit for selectively pulling toward ground one of the bit lines in the selected pair. In this "interleaved" architecture, a given memory address selects one of every x (e.g., one of every four) columns for read or write access. The data words stored in memory array 20 are thus interleaved with one another, in the sense that the addressing of a data word selects one column in each group of columns, along the selected row. Alternatively, memory array 20 may be arranged in a non-interleaved fashion, in which each cell in the selected row is coupled to a corresponding read/write circuit in each cycle. In that architecture, referring to FIG. 3 by way of comparison, read/write circuits 24 could reside between bit lines BL[n-1:0], and column select circuits 22, with the column select circuits selecting which read/write circuits 24 (and thus which columns) are in communication with data bus DATA I/O.

The construction of memory cells arranged in memory array 20, according to one embodiment of this invention, will now be described in connection with FIG. 4. This construction will be described using, by way of example, SRAM cells formed of cross-coupled CMOS inverters, because it is contemplated that this invention is especially beneficial when used in connection with such memory cells. However, it is also contemplated that embodiments of this invention will provide important benefits in memories of other types, such as SRAM cells with resistor loads, 8-T or 10-T SRAM cells (e.g., SRAM cells including separate read and write bit lines), ferroelectric static RAM (FeRAM) cells based on cross-coupled inverters, and the like. It is contemplated that those skilled in the art having reference to this specification will be readily able to apply embodiments of this invention to advantage in connection with such other memory cell types and technologies.

Figure 4:
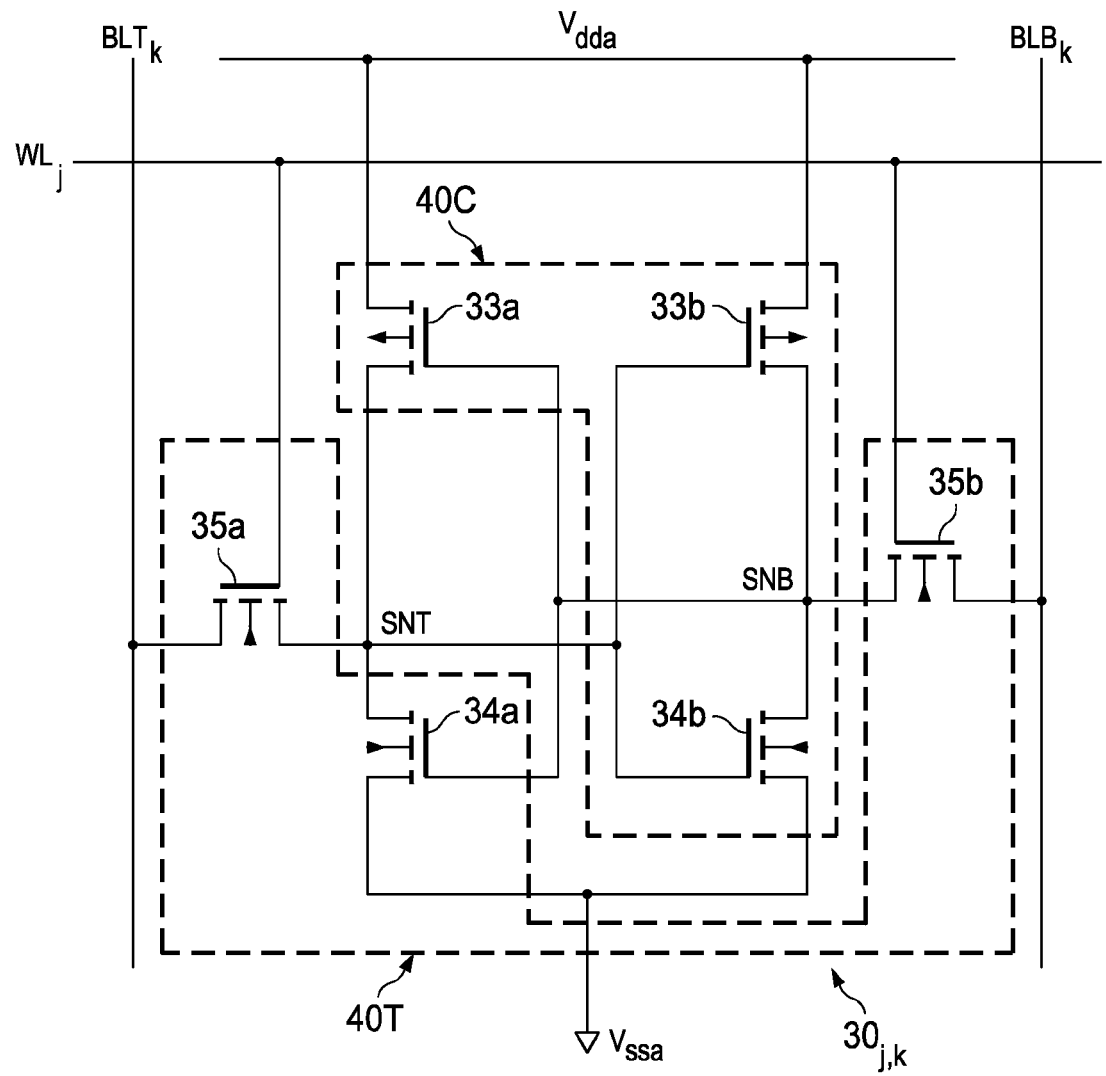
FIG. 4 is an electrical diagram, in schematic form, of a memory cell in the memory of FIG. 3 according to an embodiment of the invention.

FIG. 4 illustrates the construction of SRAM cell $30_{j,k}$ according to an embodiment of this invention. In this construction, SRAM cell $30_{j,k}$ includes a storage element formed by a pair of cross-coupled CMOS inverters. One inverter is formed by p-channel MOS load transistor 33a and n-channel MOS driver transistor 34a, which have their drains connected together at storage node SNT and their gates connected together at storage node SNB. The source of load transistor 33a is connected to power supply node $V_{dda}$, and the source of driver transistor 34a is connected to ground, or reference, node $V_{ssa}$. The other inverter in SRAM cell $30_{j,k}$ consists of p-channel MOS load transistor 33b and n-channel MOS driver transistor 34b. The drains of transistors 33b, 34b are connected together at storage node SNB, and their gates are connected together and connected to storage node SNT, cross-coupling the two inverters with one another in the usual manner for a CMOS SRAM cell. The source of transistor 33b is at power supply node $V_{dda}$ and the source of transistor 34b is at ground node $V_{ssa}$. Storage nodes SNT and SNB constitute complementary storage nodes in SRAM cell $30_{j,k}$, in that when SRAM cell $30_{j,k}$ is not accessed, their logic states are complementary to each other (one at a logic "0" and the other at a logic "1").

When deployed in a memory architecture such as that described above relative to FIG. 3, SRAM cell $30_{j,k}$ corresponds to the memory cell in row j and column k of that memory array 20. As such, SRAM cell $30_{j,k}$ includes n-channel MOS pass-gate transistor 35a with its source/drain path connected between storage node SNT and bit line $BLT_k$ (for column k in memory array 20); similarly, n-channel MOS pass-gate transistor 35b has its source/drain path connected between storage node SNB and bit line $BLB_k$. The gates of pass-gate transistors 35a, 35b are connected to word line $WL_j$, which is driven by row decoder 25 responsive to the received row address indicating selection of row j. In the architecture of FIG. 3, for example, bit lines $BLT_k$, $BLB_k$ are coupled to bit line precharge circuitry 27, on one end, and to column select circuitry 22, on the other. Each of memory cells 30 in column k of memory array 20 are, of course, also coupled to bit lines $BLT_k$, $BLB_k$. Similarly, each of memory cells 30 in row j of memory array 20 are coupled to word line $WL_j$.

Figure 5:
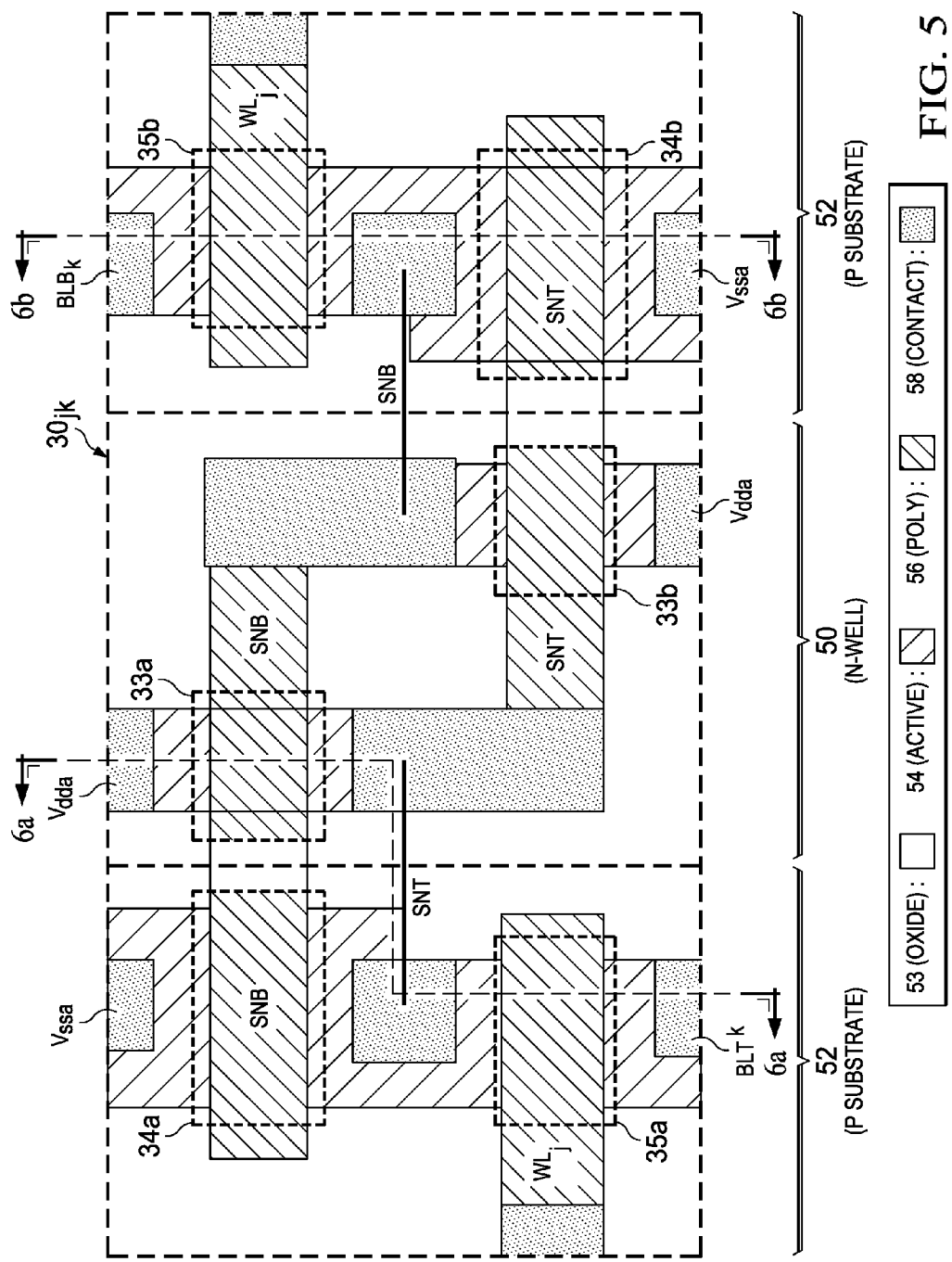
FIG. 5 is a plan view of the surface of an integrated circuit illustrating an example of the layout of a 6-T memory cell to which embodiments of the invention may be applied.
Figure 6A:
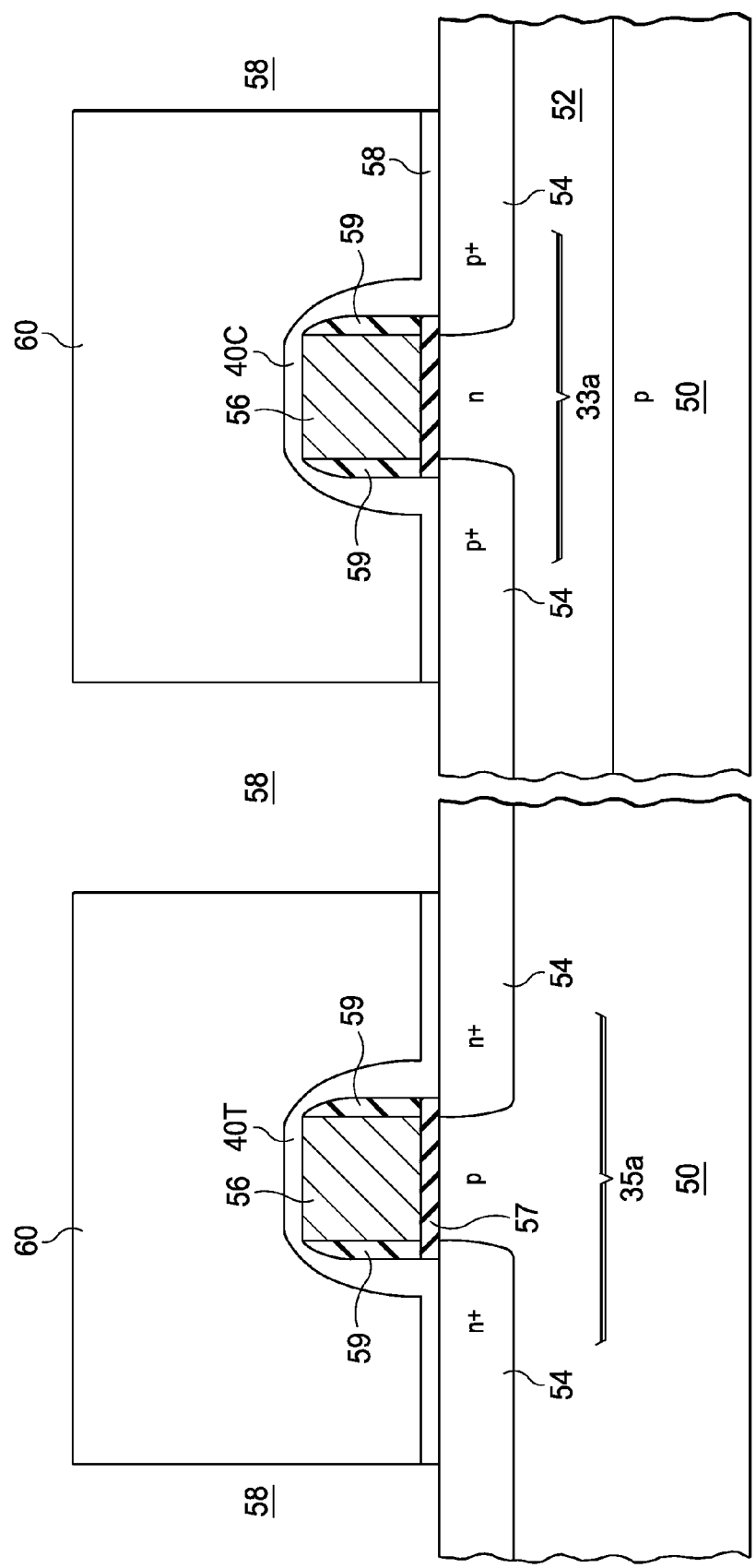
FIGS. 6a and 6b are cross-sectional views of the integrated circuit of FIG. 5, according to an embodiment of the invention.
Figure 6B:
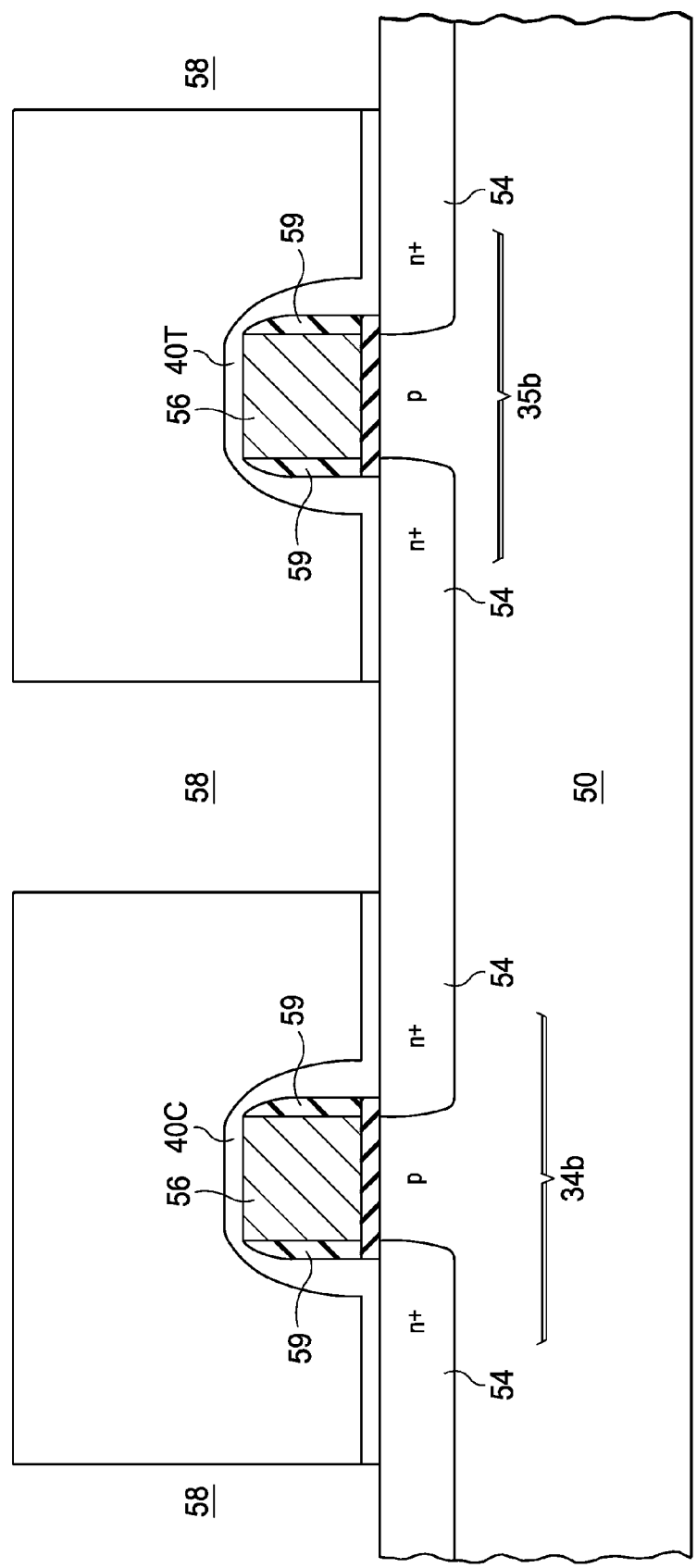

FIG. 5 is a plan view, and FIGS. 6a and 6b are cross-sectional views, of an example of the layout of memory cell $30_{j,k}$ at the surface of a silicon substrate, fabricated according to CMOS technology, and at a stage in the manufacture prior to the formation of overlying metal layers. In this example, cell $50_{j,k}$ is formed into a region of p-type substrate 52, into which n-well 50 has been formed by conventional methods. N-channel MOS transistors 34a, 35a, are formed in one region of p-type substrate 52, and n-channel MOS transistors 34b, 35b are formed into another region of p-type substrate 52. P-channel MOS transistors 33a, 33b are formed into n-well 50, which in this example lies between the two regions of p-type substrate 52 in cell $30_{j,k}$; as will become evident from the following description, adjacent cells 30 can be formed on all four sides of cell $30_{j,k}$, such that n-well 50 and regions of substrate 52 can be shared from cell to cell. In the conventional manner, active regions 54 are defined at the surface, between isolation oxide structures 53 formed as LOCOS field oxide or as shallow trench isolation (STI) structures, also in the conventional manner. Polysilicon elements 56 are patterned to extend above the surface, separated from the surface by gate oxide 57 or by isolation oxide 53, as the case may be. Active regions 54 within n-well 50 that are not underlying poly elements 56 will be p-type, and active regions 54 within regions of p-type substrate 52 that are not underlying poly elements 56 will be n-type. Contact openings 58 extend to active regions 54 or to poly elements 56, at the locations shown in FIG. 5 for this layout. Metal conductors (shown schematically in FIG. 5) will overly the structure, making contact via respective contact openings 58.

FIG. 5 illustrates the outline of the various transistors 33, 34, 35 within cell $30_{j,k}$, corresponding to the electrical schematic of FIG. 4. As is fundamental in the art, MOS transistors are located at regions of the surface at which a gate element (i.e., poly element 56 in this example) overlies an instance of active region 54. The metal conductors shown schematically in FIG. 5 interconnect these transistors according to the schematic of FIG. 4. In this example, a metal conductor connects storage node SNB from active region 54 at the drain of transistor 34b to active region 54 at the drain of transistor 33b and to polysilicon element 56 serving as the gate of transistors 33a, 34a (via a shared contact opening 58). Similarly, a metal conductor connects storage node SNT from active region 54 between transistors 34a, 35a to active region 54 at the drain of transistor 33a, and (via shared contact opening 58) to polysilicon element 56 serving as the gates of transistors 33b, 34b.

Of course, the layout of FIG. 8 is presented by way of example only, it being understood that the particular layout of cell $30_{j,k}$ can vary widely from that shown, depending on the particular manufacturing technology and design rules applicable to each implementation, and on the layout optimization arrived at by those skilled in that art.

According to embodiments of this invention, SRAM cell $30_{j,k}$ is constructed according to a dual stress liner (DSL) manufacturing technology. As known in the art and as described above in connection with the Background of the Invention, DSL technology is intended to improve the performance of n-channel and p-channel MOS transistors by applying a strain to the silicon in the transistor channel region. As known in the art, a compressive strain applied to the single-crystal silicon channel region of a p-channel MOS transistor can improve the mobility in its channel region and improve transistor performance; conversely, a tensile strain applied to the channel region of an n-channel MOS transistor can improve its transistor performance.

FIG. 6a illustrates, in cross-section, the placement of compressive nitride liner layer 40C and tensile nitride liner layer 40T over transistors 35a, 33a of SRAM cell $30_{j,k}$ according to an embodiment of the invention. As shown in this FIG. 6a, tensile nitride liner layer 40T is present over polysilicon element 56 serving as the gate electrode of transistor 35a (and also over sidewall nitride filaments 59 on the sidewalls of polysilicon element 56, which are provided to define graded source/drain junction profiles as known in the art). Tensile nitride liner layer 40T also extends over surface of active regions 54 extending away from the gate electrode, exerting a tensile strain on the underlying single-crystal silicon of active regions 54 and the channel region underlying polysilicon element 56 and gate oxide 57. In similar fashion, FIG. 6a shows compressive nitride liner layer 40C is in place over polysilicon element 56 serving as the gate electrode of transistor 33a, extending over the surface of the source and drain of transistor 33a, and thus exerting a compressive strain on active regions 54 of this device, including the channel region underlying polysilicon element 56. Planarizing dielectric layer 60 is disposed over liner layers 40T, 40C in the conventional manner. Contact openings 58 are etched through dielectric layer 60, tensile liner layer 40T, and compressive liner layer 40C, to enable overlying metal conductors to make contact to active regions 54 at the desired locations.

As evident from FIG. 6a, compressive liner layer 40C and tensile liner layer 40T are effectively formed to about the same thickness over p-channel and n-channel transistors, respectively. The manufacturing process for forming these layers may follow that known in the art for DSL technology. For example, a generalized approach to the formation of compressive liner layer 40C and tensile liner layer 40T begins with the deposition of a thin silicon dioxide etch stop layer overall, after the formation, patterning and etch of polysilicon elements 56 (and, typically, the ion implantation and anneal of dopant to form the transistor source/drain regions). Following deposition of the silicon dioxide etch stop layer, one of liner layers (e.g., compressive liner layer 40C) is deposited overall, for example by way of chemical vapor deposition (CVD) of silicon nitride under the appropriate conditions (as known in the art) to result in a compressive stress within the deposited film. Another etch stop layer of silicon dioxide is then deposited overall, and photolithographically patterned to expose compressive nitride liner layer 40C over those locations at which it is to be removed, such as the region of transistor 35a of FIG. 6a; the silicon dioxide remains in locations (e.g., at the location of transistor 33a) at which compressive liner layer 40C is to remain. Compressive nitride liner layer 40C is then etched where exposed by the patterned silicon dioxide layer, so that compressive liner layer 40C remains over those transistors at which compressive strain is to be exerted. Tensile silicon nitride layer 40T is then deposited overall, for example by way of CVD under conditions resulting in a tensile stress within the deposited film. Another thin layer of silicon dioxide is then deposited, photolithographically patterned and etched, to expose the surface of tensile nitride liner layer 40T at the desired locations (e.g., the location of transistor 33a of FIG. 6a). Silicon nitride etch is then performed again, removing tensile nitride liner layer 40T from those locations, stopping at the silicon dioxide etch stop layer remaining at the surface of compressive nitride liner layer 40C. Formation of the dual liner layers is thus complete. It will be understood that other methods of forming the compressive and tensile liner layers may alternatively be used, and that the particular order of formation of these layers is of no particular importance to embodiments of this invention.

Referring back to FIG. 4, according to this embodiment of the invention, asymmetry is incorporated into SRAM cell $30_{j,k}$ by forming compressive liner layer 40C over n-channel driver transistor 34b, while forming tensile liner layer 40T over n-channel driver transistor 34a on the other side of SRAM cell $30_{j,k}$. Compressive liner layer 40C is also formed over p-channel load transistors 33a, 34b, and tensile liner layer 40T is also formed over n-channel pass-gate transistors 35a, 35b. FIG. 6b illustrates this construction by way of cross-section, in which n-channel driver transistor 34b underlies compressive nitride liner layer 40C (as do p-channel load transistors 33a, 33b in SRAM cell $30_{j,k}$), while n-channel pass-gate transistor 35b underlies tensile nitride liner layer 40T (similarly as the other n-channel transistors 34a, 35a in SRAM cell $30_{j,k}$).

As a result of this construction, driver transistor 34a has a stronger drive characteristic than does driver transistor 34b, because transistor 34a is enhanced by the tensile strain applied to its channel region by tensile liner layer 40T while transistor 34b is degraded by the compressive strain applied to its channel region by compressive liner layer 40C. SRAM cell $30_{j,k}$ thus has asymmetric transfer function behavior, which as discussed above, can improve the static noise margin and cell stability of SRAM cell $30_{j,k}$.

According to embodiments of this invention, the implementation of asymmetry within memory array 20 constructed of asymmetric SRAM cells $30_{j,k}$ can be efficiently implemented, with no additional photomasks or ion implantation processes required, and with no increase in the memory cell chip area. This implementation will now be described in connection with the plan layout views of FIGS. 7a and 7b, for the case of SRAM cell $30_{j,k}$ of FIGS. 4 and 5.

Figure 7A:
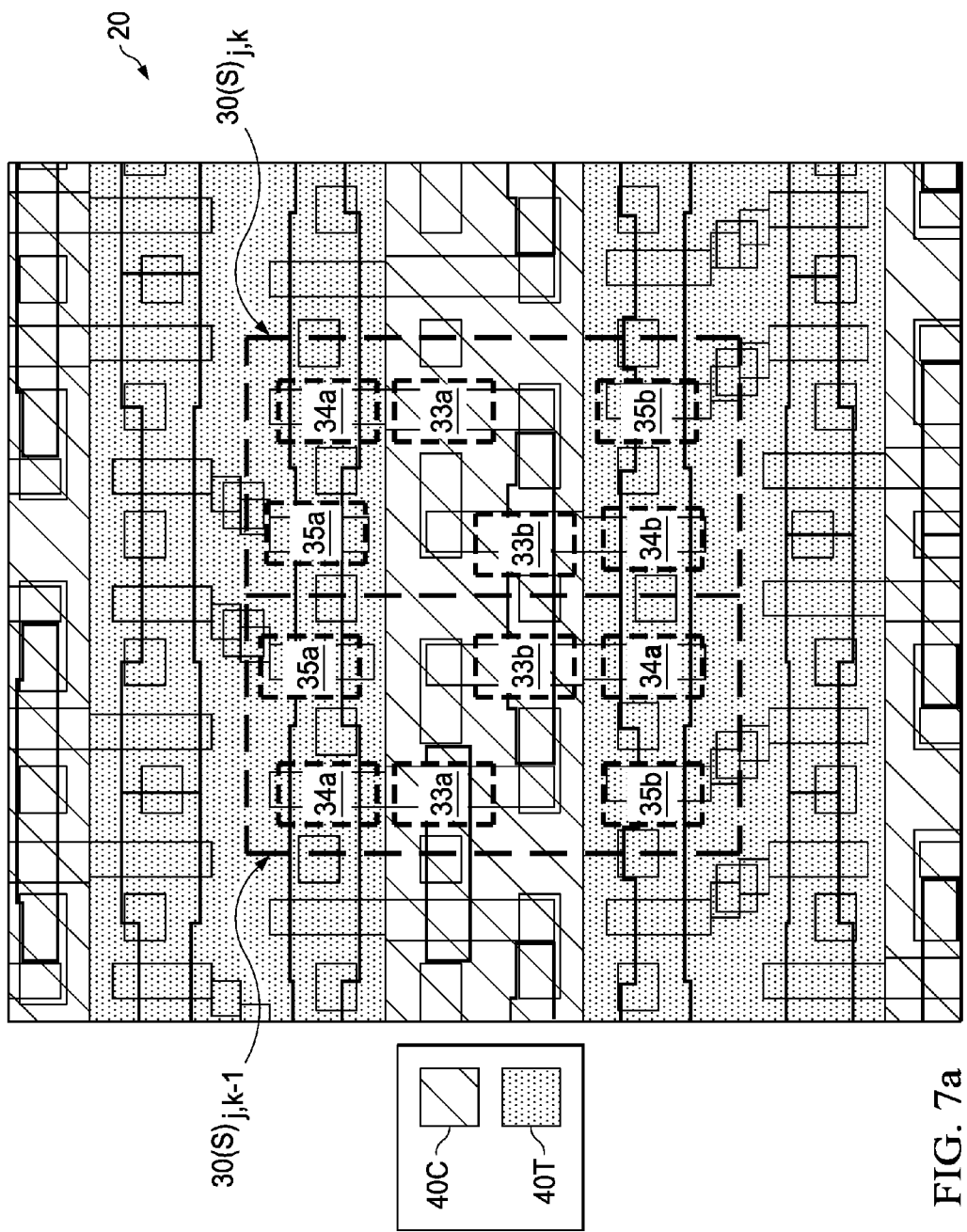
FIGS. 7a and 7b are plan layout views of a portion of a memory array illustrating the placement of compressive and tensile liner layers for symmetric behavior, and for asymmetric behavior according to an embodiment of the invention, respectively.

FIG. 7a illustrates the layout of a portion of memory array 20, including SRAM cells 30(S) that are constructed in a symmetric manner, but including dual stress liner (DSL) technology. In this symmetric implementation, compressive liner layer 40C is disposed over all p-channel MOS transistors (i.e., load transistors 33a, 33b in each cell), and tensile liner layer 40T is disposed over all n-channel MOS transistors (i.e., driver transistors 34a, 34b; pass-gate transistors 35a, 35b). In this layout, as shown in FIG. 7a, liner layers 40C, 40T are arranged over memory array 20 (including symmetric SRAM cells $30(S)_{j,k-1}$, $30(S)_{j,k}$ and their near neighbors) essentially in strips. This formation of liner layers 40C, 40T involves the use of two photolithography steps (i.e., two photomasks) to define the location of each liner layer 40C, 40T.

Figure 7B:

FIG. 7b illustrates the implementation of the asymmetry described above in connection with FIGS. 4 and 6b, in the context of memory array 20 including SRAM cell $30_{j,k}$ of FIG. 5. As shown in FIG. 7b, compressive nitride liner layer 40C extends over the area including p-channel transistors 33a, 33b, and also over n-channel driver transistor 34b in each of SRAM cells $30_{j,k-1}$, $30_{j,k}$. Tensile nitride liner layer 40T extends over n-channel pass-gate transistors 35b in SRAM cells $30_{j,k-1}$, $30_{j,k}$, as well as in each cell within memory array 20. As evident from the layout of FIG. 7b, the various memory cells are mirror-imaged with one another (e.g., as shown below SRAM cells $30_{j,k-1}$, $30_{j,k}$) to minimize the complexity of the photomask structures used to define liner layers 40C, 40T. Furthermore, as evident from a comparison of FIGS. 7a and 7b, no additional photomask or photolithography step, relative to the symmetric case of FIG. 7a, is required to incorporate asymmetry into memory array 20 according to the embodiment of the invention shown in FIG. 7b. Indeed, if dual stress liner technology is used for any portion of integrated circuit 10 in which memory array 20 is implemented, those same photomasks, and photolithography, deposition, and etch processes, are already present within the manufacturing flow. The only difference necessary is the particular pattern in the photomasks used to define the locations of liner layers 40T, 40C.

Figure 8A:
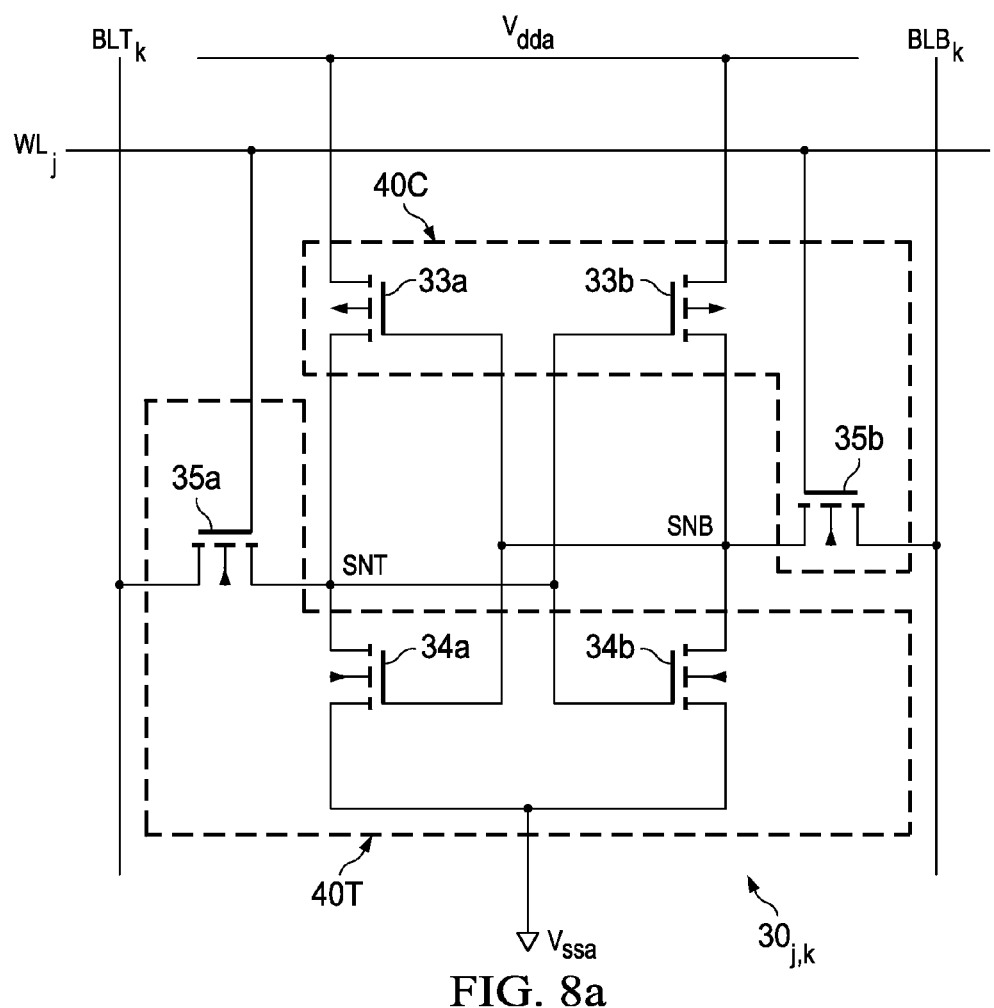
FIG. 8a is an electrical diagram, in schematic form, of a memory cell in the memory of FIG. 3 according to another embodiment of the invention.

FIG. 8a illustrates, as an electrical schematic, the arrangement of SRAM cell $30'_{j,k}$ according to an alternative embodiment of the invention. In this embodiment of the invention, asymmetry in the characteristics of SRAM cell $30'_{j,k}$ is implemented by constructing pass-gate transistors 35a, 35b asymmetrically relative to one another, while driver transistors 34a, 34b are constructed to match one another. More specifically, re-channel pass-gate transistor 35a is provided with tensile nitride liner layer 40T as before, but n-channel pass-gate transistor 35b is deployed with compressive nitride liner layer 40C (as are p-channel load transistors 33a, 33b). As a result, pass-gate transistor 35a will have a stronger drive characteristic than will pass-gate transistor 35b, because transistor 35a is enhanced by the tensile strain applied to its channel region by tensile liner layer 40T while transistor 35b is degraded by the compressive strain applied to its channel region by compressive liner layer 40C. SRAM cell $30'_{j,k}$ thus has asymmetric transfer function behavior, which as discussed above, can improve the static noise margin and cell stability of SRAM cell $30_{j,k}$.

Figure 8B:
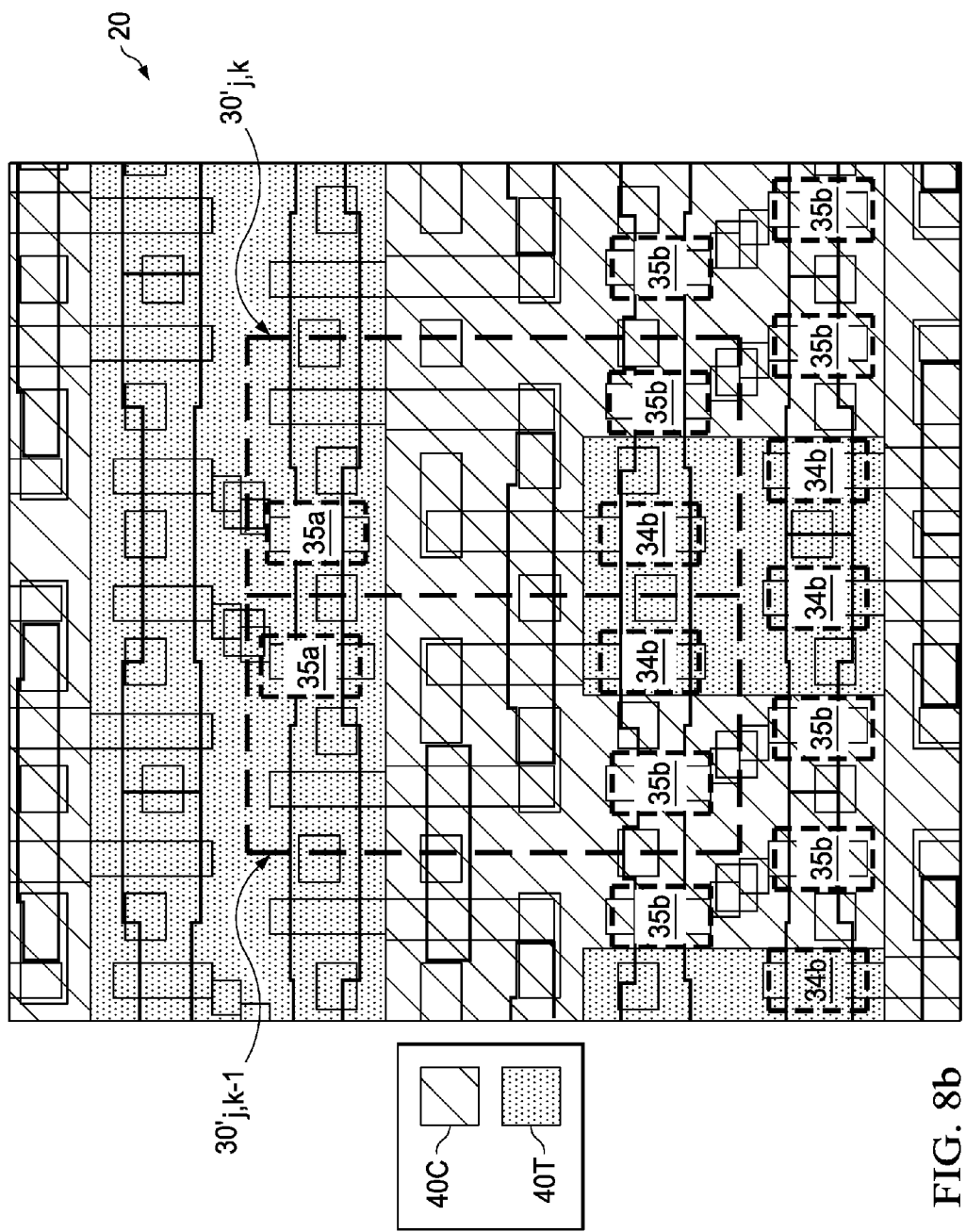

FIG. 8b illustrates, in plan layout view, the arrangement of SRAM cells $30'_{j,k-1}$, $30'_{j,k}$ and their near neighbors in a portion of memory array 20 according to this embodiment of the invention. As shown in FIG. 8b, compressive nitride liner layer 40C and tensile nitride liner layer 40T are placed so that n-channel pass-gate transistors 35b in each SRAM cell 30 are deployed with compressive nitride liner layer 40C, while n-channel driver transistors 34b (as well as driver transistors 34a and pass-gate transistors 35a) are deployed with tensile nitride liner layer 40T. As in the layout of FIG. 7b, no additional photomask or photolithography process step is required to implement memory cell asymmetry according to this embodiment of the invention, relative to the symmetric DSL case illustrated in FIG. 7a or to any implementation of DSL technology within the same integrated circuit. Rather, it is simply the pattern of the photomasks defining the location of liner layers 40C, 40T that implements the desired asymmetry.

Figure 9A:
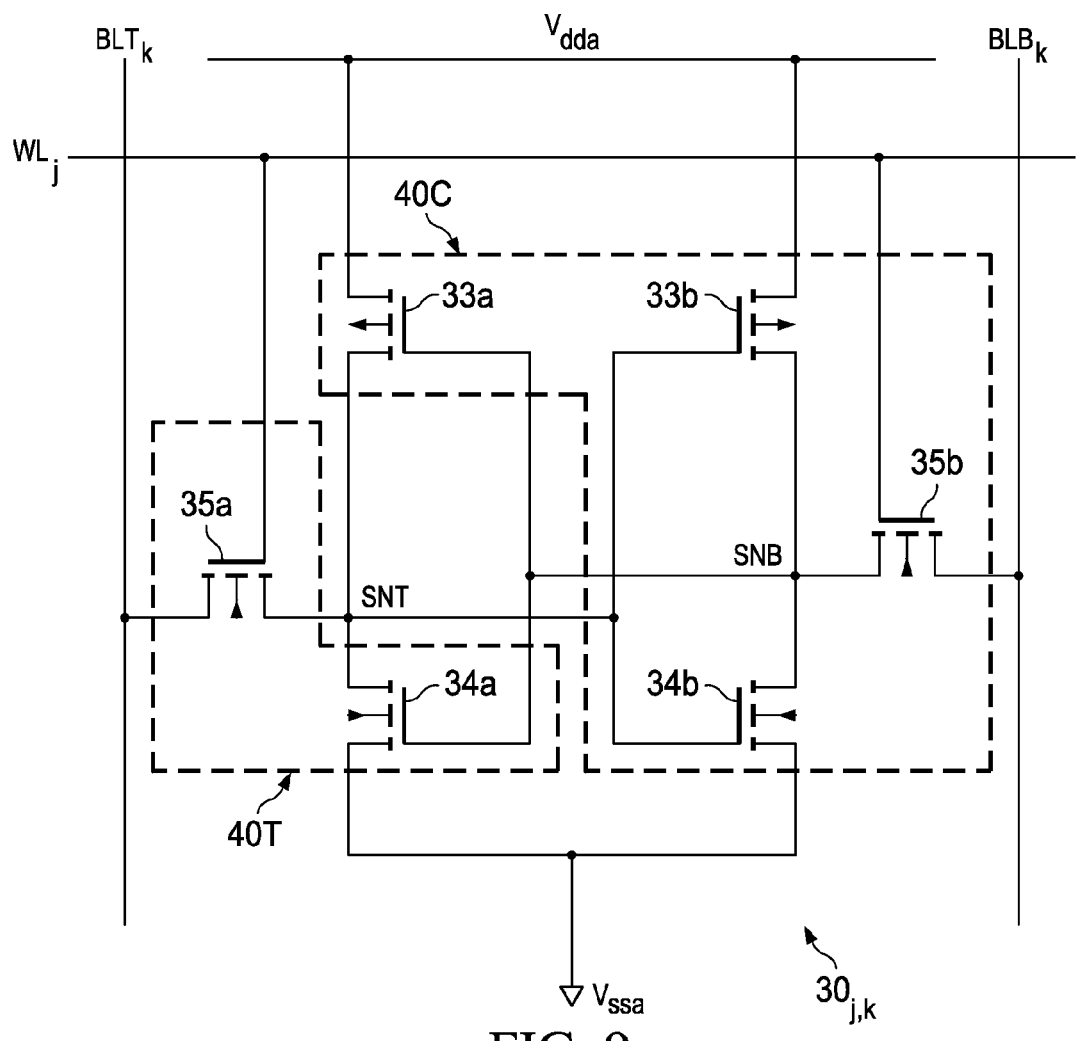
FIG. 9a is an electrical diagram, in schematic form, of a memory cell in the memory of FIG. 3 according to another embodiment of the invention.
Figure 9B:
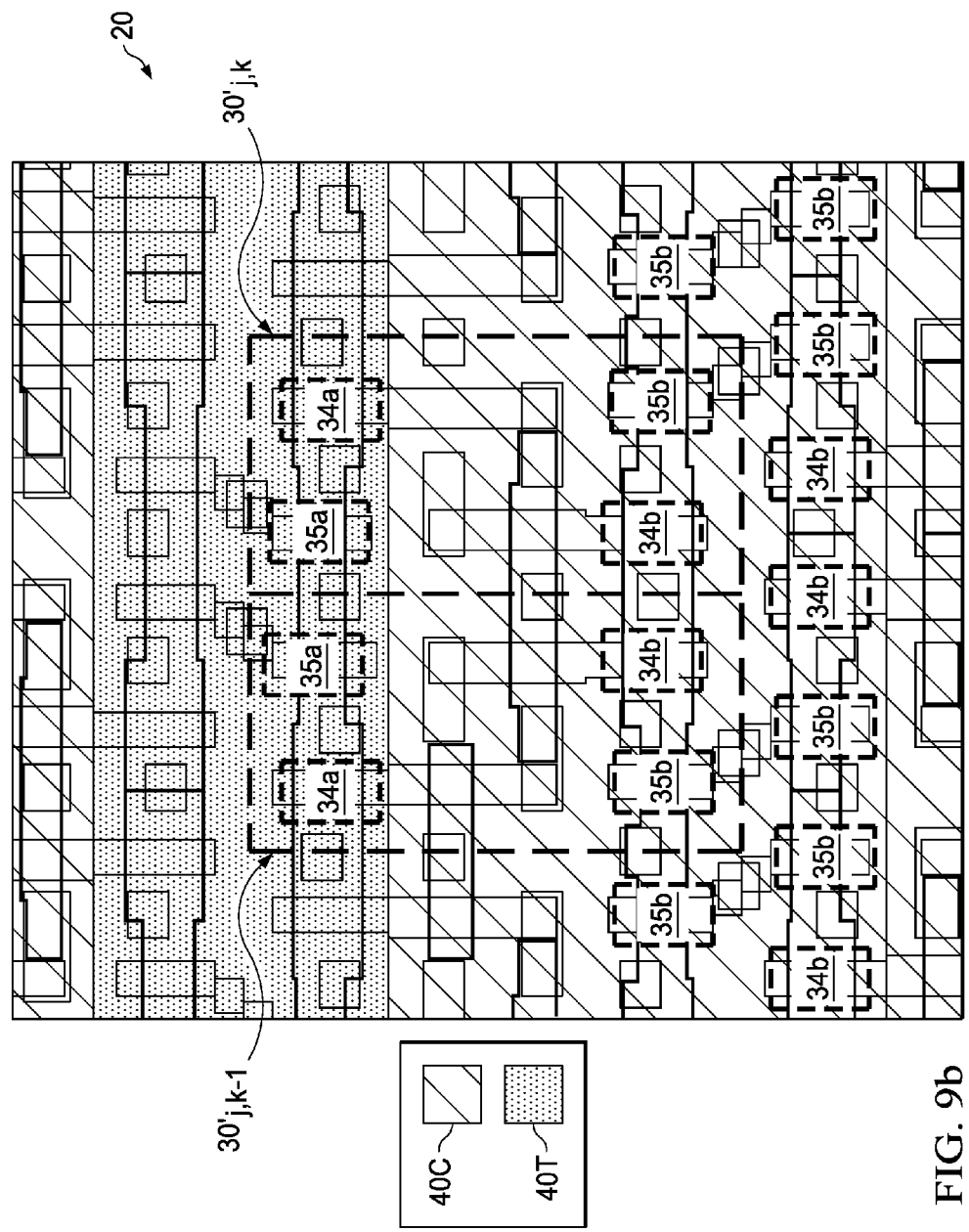

FIGS. 9a and 9b illustrate, in schematic and plan layout views, respectively, another embodiment of this invention in connection with SRAM cell $30''_{j,k}$. As shown in FIG. 9a, both of n-channel driver transistor 34b and n-channel pass-gate transistor 35b are implemented with compressive nitride liner layer 40C, along with p-channel load transistors 33a, 33b. On the other side of SRAM cell $30''_{j,k}$, n-channel driver transistor 34a and n-channel pass-gate transistor 34a are implemented with tensile nitride liner layer 40T. As a result, both of driver transistor 34a and pass-gate transistor 35a will have stronger drive characteristics than their respective counterparts, driver transistor 34b and pass-gate transistor 35b, because transistors 34a, 35a are enhanced by the tensile strain applied to its channel region by tensile liner layer 40T while transistors 34b, 35b are degraded by the compressive strain applied to its channel region by compressive liner layer 40C. SRAM cell $30''_{j,k}$ thus has asymmetric transfer function behavior, to a greater extent than the asymmetry of SRAM cells $30_{j,k}$, $30'_{j,k}$ in the other embodiments of the invention described above.

FIG. 9b illustrates, in plan layout view, the arrangement of SRAM cells $30''_{j,k-1}$, $30''_{j,k}$ and their near neighbors in a portion of memory array 20 according to this embodiment of the invention. As shown in FIG. 9b, compressive nitride liner layer 40C is placed over much of the layout of memory array 20, in a continuous film overlying p-channel transistors 33a, 33b, driver transistor 34b, and pass-gate transistor 35b in adjacent rows of SRAM cells 30'' in memory array 20. Tensile nitride liner layer 40T is formed to overlie n-channel driver transistor 34a and pass-gate transistor 35a. As in the embodiments of the invention described above relative to FIGS. 7a and 7b, no additional photomask or photolithography process step is required to implement memory cell asymmetry according to this embodiment of the invention. Asymmetry is incorporated due to the pattern of the photomasks defining the location of liner layers 40C, 40T.

Other alternative implementations of this invention are also contemplated. For example, the pass-gate transistors in each SRAM cell may be p-channel rather than re-channel MOS transistors. In that case, asymmetry involving pass-gate transistors of asymmetric drive may be implemented in the same manner, with one of the p-channel pass-gate transistors having a tensile nitride liner layer and the other having a compressive nitride liner layer. Further in the alternative, asymmetry may be implemented by applying a tensile nitride liner layer to one but not the other of the p-channel load transistors in the SRAM cell. And, of course, the polarity of the asymmetry is of no particular relevance in the general sense, but will typically depend on other factors (e.g., precharge voltage of the bit lines, trip voltages of the cross-coupled inverters, etc.) that indicate the polarity of the asymmetry required to attain the improved cell stability and static noise margin. It is contemplated that this invention may also be applied to other memory cells, including SRAM cells of the 8-T and 10-T type, as well as other static memory cells such as non-volatile floating-gate and ferroelectric memory cells.

According to embodiments of this invention, therefore, cell stability and static noise margin are improved for memory cells of the cross-coupled inverter type, in a manner that is essentially cost-free from the standpoints of chip area and manufacturing cost. This improvement in cell stability can enable the designer to greatly strengthen the pass-gate transistors to improve write margin, with reduced concern over degraded cell stability that may result. The power consumed by memory cells according to embodiments of this invention is also essentially identical to that of conventional 6-T SRAM cells, such that little or no power penalty is suffered.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory cell, comprising:
a first inverter circuit including an inverter and a pass-gate transistor, having an output for coupling a first storage node between its inverter and its pass-gate transistor to a first bit line, and having an input, the first inverter circuit constructed of one or more p-channel metal-oxide-semiconductor (MOS) transistors, and one or more n-channel MOS transistors, wherein the p-channel MOS transistors are constructed with a compressive liner layer and the n-channel MOS transistors are constructed with a tensile liner layer; and
a second inverter circuit including an inverter and a pass-gate transistor, having an output for coupling a second storage node between its inverter and its pass-gate transistor to a second bit line, the second storage node coupled to the input of the inverter, the second inverter circuit having an input coupled to the first storage node in the first inverter circuit, the second inverter circuit constructed of one or more p-channel MOS transistors and one or more n-channel MOS transistors;
wherein one of the MOS transistors of the second inverter circuit is constructed with a liner layer of opposite stress characteristics from that of a corresponding MOS transistor in the first inverter circuit.

2. The memory cell of claim 1, wherein the inverter of the first inverter circuit comprises:

an n-channel MOS drive transistor constructed with a tensile liner layer, having a source coupled to a reference voltage, a gate connected to the input of the inverter circuit, and a drain coupled to the first storage node; and
a p-channel MOS transistor constructed with a compressive liner layer, having a drain coupled to the first storage node, a gate connected to the input of the inverter circuit, and a source coupled to a power supply voltage;
wherein the inverter of the second inverter circuit comprises:
an n-channel MOS drive transistor having a source coupled to a reference voltage, a gate connected to the input of the inverter circuit, and a drain coupled to the first storage node; and
a p-channel MOS load transistor having a drain coupled to the first storage node, a gate connected to the input of the inverter circuit, and a source coupled to a power supply voltage.

3. The memory cell of claim 2, wherein both the p-channel MOS load transistor and the n-channel MOS driver transistor of the second inverter circuit are constructed with a compressive liner layer.

4. The memory cell of claim 3, wherein the pass-gate transistor of the first inverter circuit comprises an n-channel MOS transistor constructed with a tensile liner layer, having a source/drain path coupled between the first storage node and the first bit line, and a gate for receiving a word line signal;
and wherein the pass-gate transistor of the second inverter circuit comprises an n-channel MOS transistor constructed with a compressive liner layer, having a source/drain path coupled between the second storage node and the second bit line, and a gate for receiving the word line signal.

5. The memory cell of claim 2, wherein the pass-gate transistor of the first inverter circuit comprises an n-channel MOS transistor constructed with a tensile liner layer, having a source/drain path coupled between the first storage node and the first bit line, and a gate for receiving a word line signal;
and wherein the pass-gate transistor of the second inverter circuit comprises an n-channel MOS transistor constructed with a compressive liner layer, having a source/drain path coupled between the second storage node and the second bit line, and a gate for receiving the word line signal.

6. The memory cell of claim 1, wherein each of the compressive liner layer and tensile liner layer comprise silicon nitride.

7. A method of constructing a memory array in an integrated circuit at a semiconductor surface of a body, the memory array comprising a plurality of memory cells arranged in rows and columns, each row of memory cells associated with a word line, each column of memory cells associated with first and second bit lines, each memory cell storing a data state represented at complementary first and second storage nodes driven from the outputs of first and second cross-coupled inverters, respectively, the method comprising:
defining n-type and p-type regions at the surface;
forming gate electrodes overlying selected locations for each of the memory cells, the gate electrodes within each memory cell serving as the gate of transistors within each memory cell;
for each of the memory cells, forming p-type source and drain regions on opposing sides of a plurality of p-channel transistors;

for each of the memory cells, forming n-type source and drain regions on opposing sides of a plurality of n-channel transistors;

for each of the memory cells, forming a compressive liner layer over the source and drain regions, and the gate, of the plurality of p-channel transistors and at least one of the n-channel transistors; and for each of the memory cells, forming a tensile liner layer over others of the n-channel transistors.

8. The method of claim 7, wherein the plurality of p-channel transistors in each of the memory cells comprises first and second p-channel load transistors;

wherein the plurality of n-channel transistors in each of the memory cells comprises first and second n-channel driver transistors, wherein the step of forming the compressive liner layer forms the compressive liner layer over the gate electrode and the source and drain regions for the first and second load transistors and the second n-channel driver transistor;

and wherein the step of forming the tensile liner layer forms the tensile liner layer over the gate electrode and the source and drain regions for the first n-channel driver transistor.

9. The method of claim 8, wherein the plurality of n-channel transistors in each of the memory cells further comprises first and second n-channel pass-gate transistors;

wherein the step of forming the compressive liner layer also forms the compressive liner layer over the second n-channel driver transistor;

and wherein the step of forming the tensile liner layer also forms the tensile liner layer over the gate electrode and the source and drain regions for the first n-channel pass-gate transistor.

10. The method of claim 7, wherein the plurality of p-channel transistors in each of the memory cells comprises first and second p-channel load transistors;

wherein the plurality of n-channel transistors in each of the memory cells comprises first and second n-channel driver transistors and first and second n-channel pass-gate transistors;

wherein the step of forming the compressive liner layer forms the compressive liner layer over the gate electrode and the source and drain regions for the first and second load transistors and the second n-channel pass-gate transistor;

and wherein the step of forming the tensile liner layer forms the tensile liner layer over the gate electrode and the source and drain regions for the first and second n-channel driver transistors and the first n-channel pass-gate transistor.

11. An integrated circuit, comprising a solid state memory, the memory comprising:

an array of solid-state memory cells arranged in rows and columns, each memory cell comprising:

a first inverter circuit including an inverter and a pass-gate transistor, having an output for coupling a first storage node between its inverter and its pass-gate transistor to a first bit line for its column responsive to a word line for its row, and having an input, the first inverter circuit constructed of one or more p-channel metal-oxide-semiconductor (MOS) transistors, and one or more n-channel MOS transistors, wherein the p-channel MOS transistors are constructed with a compressive liner layer and the n-channel MOS transistors are constructed with a tensile liner layer; and a second inverter circuit including an inverter and a pass-gate transistor, having an output for coupling a second storage node between its inverter and its pass-gate transistor to a second bit line for its column responsive to a word line for its row, the second storage node coupled to the input of the inverter, the second inverter circuit having an input coupled to the first storage node in the first inverter circuit, the second inverter circuit constructed of one or more p-channel MOS transistors and one or more n-channel MOS transistors;

address select circuitry, for receiving a row address and a column address, for energizing a word line associated with a row of memory cells corresponding to the row address; and read/write circuitry coupled to the first and second bit lines of each column of memory cells;

wherein one of the MOS transistors of the second inverter circuit in each of the memory cells is constructed with a liner layer of opposite stress characteristics from that of a corresponding MOS transistor in the first inverter circuit.

12. The integrated circuit of claim 11, wherein the inverter of the first inverter circuit in each of the memory cells comprises:

an n-channel MOS drive transistor constructed with a tensile liner layer, having a source coupled to a reference voltage, a gate connected to the input of the inverter circuit, and a drain coupled to the first storage node; and a p-channel MOS transistor constructed with a compressive liner layer, having a drain coupled to the first storage node, a gate connected to the input of the inverter circuit, and a source coupled to a power supply voltage;

wherein the inverter of the second inverter circuit in each of the memory cells comprises:

an n-channel MOS drive transistor having a source coupled to a reference voltage, a gate connected to the input of the inverter circuit, and a drain coupled to the first storage node; and a p-channel MOS load transistor having a drain coupled to the first storage node, a gate connected to the input of the inverter circuit, and a source coupled to a power supply voltage.

13. The integrated circuit of claim 12, wherein both the p-channel MOS load transistor and the n-channel MOS driver transistor of the second inverter circuit, in each of the memory cells, are constructed with a compressive liner layer.

14. The integrated circuit of claim 13, wherein the pass-gate transistor of the first inverter circuit in each of the memory cells comprises an n-channel MOS transistor constructed with a tensile liner layer, having a source/drain path coupled between the first storage node and the first bit line, and a gate connected to the word line for its row;

and wherein the pass-gate transistor of the second inverter circuit in each of the memory cells comprises an n-channel MOS transistor constructed with a compressive liner layer, having a source/drain path coupled between the second storage node and the second bit line, and a gate connected to the word line for its row.

15. The integrated circuit of claim 13, wherein the pass-gate transistor of the first inverter circuit in each of the memory cells comprises an n-channel MOS transistor constructed with a tensile liner layer, having a source/drain path coupled between the first storage node and the first bit line, and a gate connected to the word line for its row;

and wherein the pass-gate transistor of the second inverter circuit in each of the memory cells comprises an n-channel MOS transistor constructed with a compressive liner layer, having a source/drain path coupled between the second storage node and the second bit line, and a gate connected to the word line for its row.

16. The integrated circuit of claim 11, further comprising:
a logic circuit coupled to the read/write circuitry and the address select circuitry.

* * * * *